(12) United States Patent
Thiele (10) Patent No.: US 7,821,319 B2
(45) Date of Patent: Oct. 26, 2010

(54) SWITCHING APPARATUS AND METHOD FOR DETECTING AN OPERATING STATE

(75) Inventor: Steffen Thiele, Muenchen (DE)

(73) Assignee: Infineon Technologies AG, Neubiberg (DE)

( * ) Notice: Subject to any disclaimer, the term of this patent is extended or adjusted under 35 U.S.C. 154(b) by 110 days.

(21) Appl. No.: 11/833,339

(22) Filed: Aug. 3, 2007

(65) Prior Publication Data

US 2008/0030256 A1   Feb. 7, 2008

(51) Int. Cl.
*H03K 17/687* (2006.01)
(52) U.S. Cl. .................. 327/427; 327/50; 327/374
(58) Field of Classification Search .......... 327/427, 327/50, 63, 65, 67, 108, 374, 376, 377, 205, 327/206
See application file for complete search history.

(56) References Cited

U.S. PATENT DOCUMENTS

| | | | | |
|---|---|---|---|---|
| 5,708,577 A * | 1/1998 | Mckinley | .................. | 363/89 |
| 5,767,545 A * | 6/1998 | Takahashi | .................. | 257/341 |
| 5,828,141 A * | 10/1998 | Foerster | .................. | 307/125 |
| 5,929,664 A * | 7/1999 | Alleven | .................. | 327/108 |
| 6,130,569 A * | 10/2000 | Aswell et al. | ............... | 327/374 |
| 6,335,638 B1 * | 1/2002 | Kwong et al. | ................. | 326/83 |
| 6,424,131 B1 * | 7/2002 | Yamamoto et al. | ......... | 323/282 |
| 6,507,227 B2 * | 1/2003 | Genova et al. | ............. | 327/109 |
| 6,531,825 B1 * | 3/2003 | Iacob | .......................... | 315/105 |
| 6,870,425 B2 * | 3/2005 | Leifso et al. | ................ | 330/254 |
| 7,106,042 B1 * | 9/2006 | Jackson | .................... | 323/316 |
| 7,298,183 B2 * | 11/2007 | Mirzaei et al. | ............. | 327/115 |
| 7,319,314 B1 * | 1/2008 | Maheshwari et al. | ........ | 323/313 |
| 7,459,954 B2 * | 12/2008 | Kuehner et al. | ............. | 327/374 |
| 2002/0017920 A1 * | 2/2002 | Bridgewater, Jr. | ........... | 326/82 |
| 2003/0016000 A1 * | 1/2003 | Sanchez | .................... | 323/284 |
| 2003/0193370 A1 * | 10/2003 | Leifso et al. | ................ | 330/254 |
| 2005/0218938 A1 * | 10/2005 | Sugano | ........................ | 327/65 |
| 2006/0006166 A1 * | 1/2006 | Chen et al. | ................. | 219/494 |
| 2006/0091924 A1 * | 5/2006 | Yamamoto et al. | .......... | 327/205 |
| 2007/0030749 A1 * | 2/2007 | Pyeon et al. | ................ | 365/226 |
| 2008/0018362 A1 * | 1/2008 | Yu et al. | ........................ | 327/65 |
| 2009/0033311 A1 * | 2/2009 | Sperling | ..................... | 323/316 |

FOREIGN PATENT DOCUMENTS

DE   102004041886 A1 *  3/2006

OTHER PUBLICATIONS

"Switching-Behavior Improvement of Insulated Gate-Controlled Devices", Salvatore Musumeci, et al., IEEE Transactions on Power Electronics, vol. 12, No. 4, Jul. 1997.

* cited by examiner

*Primary Examiner*—Lincoln Donovan
*Assistant Examiner*—Adam D Houston
(74) *Attorney, Agent, or Firm*—Dicke, Billig & Czaja, PLLC (57) ABSTRACT

A switching apparatus and method for detecting an operating state is disclosed. One embodiment has a MOS transistor, a replica of the MOS transistor and an evaluation arrangement and detects the start of switching of the MOS transistor by comparing the gate-source voltages of the transistors.

22 Claims, 5 Drawing Sheets

SWITCHING APPARATUS AND METHOD FOR DETECTING AN OPERATING STATE

CROSS-REFERENCE TO RELATED APPLICATIONS

This Utility patent application claims priority to German Patent Application No. DE 10 2006 036 349.3 filed on Aug. 3, 2006, which is incorporated herein by reference.

BACKGROUND

The present invention relates to a switching apparatus having MOS transistors, as is used, for example, to control motors, to control relays, to control lamps, for DC/DC conversion or to drive other inductive or resistive loads. As a result of their switching, such switch apparatuses produce interfering conducted and non-conducted emissions. Emissions, whether conducted or non-conducted, are generally undesirable since they may result in interference in a system. Emissions may be reduced by virtue of the MOS transistor switch carrying out the switching operation as slowly as possible. Natural limits which result from the application are imposed on slow switching. Such a limit is if the duration of the switching operation becomes too long in comparison with the duration of the switching period. Another limit is if the losses of the switching operation are greater than the losses of a switch in the switched-on state. In addition to slow switching, a constant current profile is needed to successfully reduce interference emission.

In order to suppress the remaining interference emission, filters must be used at suitable locations. Abrupt transitions in the current flow contribute to the emission. In this case, the greatest temporal change which can be achieved in the case of MOS power transistors occurs in the vicinity of threshold voltage. The apparent switching operation begins on the basis of the transfer characteristic of the power transistor, its temperature, its threshold voltage, the current density set by the load, in the event of a different voltage of the control electrode and with respect to the necessary charge on the control electrode with a fixed charging current at different times.

The problem of low-radiation switching-on has previously been solved by comparing the switched load current of the MOS transistor with a reference, for example. If the load current of the MOS transistor is less than that of this reference, the switching-on operation is slowed down. After the load current of the MOS transistor has been exceeded, the desired higher transconductance is set. Determining a particular load current of the MOS transistor as a reference value is disadvantageous in this case. This results in discontinuity in the switch current and a great variation in the delay of the switching-on operation. It is not possible to minimize the delay of the switching-on operation since a changeover operation is not carried out here until current flow has already begun. The actual start of the switching operation remains unknown in this case.

Another possibility is to charge the control connection of the MOS transistor with a linearly rising current. In this case, the delay time before the true start of the switching-on operation and the initial transconductance of the MOS transistor may vary to a very significant extent. When designing this linearly rising current for driving the MOS transistor, the load current of the application should be known. In addition, it should be taken into account that many parameters influence the start of the switching-on operation and its fluctuation.

Figure 2:
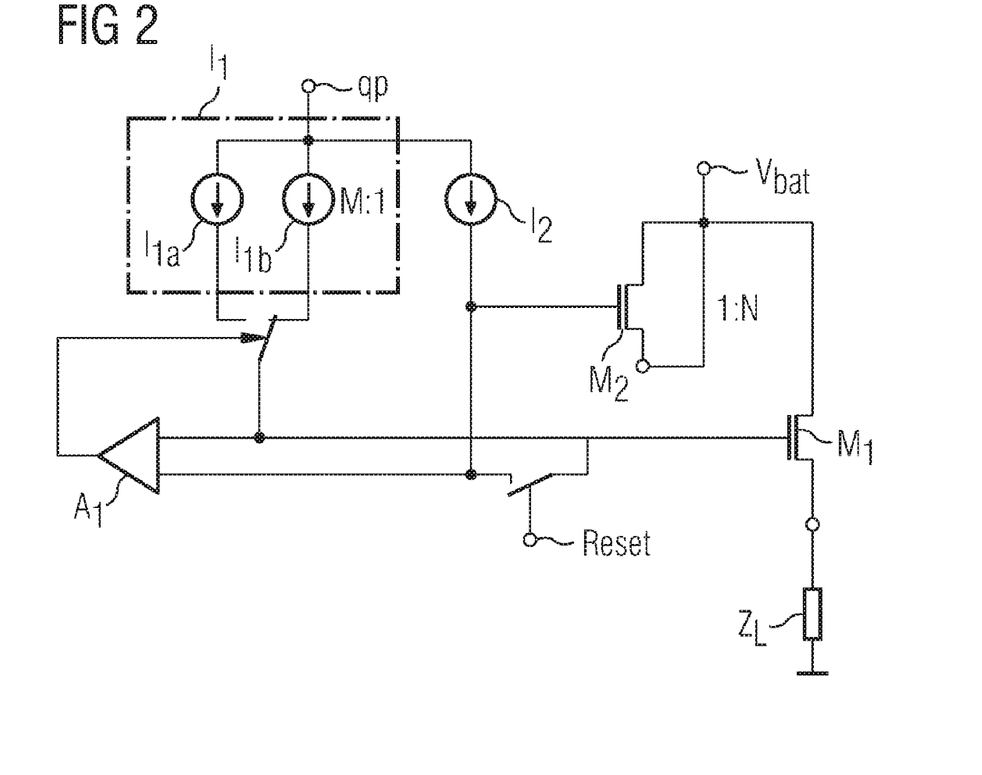
FIG. 2 illustrates a switching apparatus having a MOS transistor, which is designed to switch loads, and a replica in a HIGH-SIDE configuration.

DE 19640433 exhibits a switching apparatus having a MOS transistor for reducing the emission during the switching-off operation. FIG. 2 illustrates a zener diode chain having means which are suitable for delaying the build-up of the zener voltage so that the edges are rounded off, which reduces the emission of the switching-off operation.

DE 10000020 exhibits a circuit arrangement which is designed to drive a MOS transistor with a delay time.

DE 10061371 exhibits a circuit arrangement for driving a load, in which a semiconductor switching element having a protection circuit, in particular having an overtemperature protection circuit or a protection circuit for current limitation, can be used. The semiconductor switching element is also protected against an overvoltage on its load path.

DE 10245046 exhibits a circuit arrangement which is designed to dynamically change the commutation voltage during the commutation operation.

DE 4029794 exhibits a method for driving an electromagnetic load and a device for driving an electromagnetic load.

EP 1071213 exhibits an integrated circuit for driving a power MOS transistor with means for detecting the presence of an external load in order to optimize the switching operation of the MOS transistor.

SUMMARY

One embodiment includes a switching apparatus, including a MOS transistor, a replica of the MOS transistor and an evaluation arrangement. The apparatus detects the start of the switching of the of the MOS transistor by comparing the gate-source voltages of the transistors.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment detects the exact start of the switching operation in order to thus make it possible to manipulate the charging current of the control connection for the respective intended use in good time.

One embodiment of a circuit arrangement for detecting the start of the switching operation of a MOS transistor includes: a MOS transistor, which has a control connection and is designed to switch loads when a suitable control potential is provided at the control connection. The configuration in which the MOS transistor is connected is not important to the essence of the invention. According to one embodiment, the MOS transistor may be in the form of a HIGH-SIDE switch or a LOW-SIDE switch. In the circuit arrangement, the MOS transistor may likewise be in the form of a p-conducting MOS transistor or an n-conducting MOS transistor. As can already be discerned from the configuration in the form of a HIGH-SIDE or LOW-SIDE switch, the external load can be coupled both to the source and to the drain of the MOS transistor.

One embodiment also includes at least one replica of the MOS transistor with a control connection. A replica is understood as meaning a transistor, which is as similar as possible but is smaller. The design of such a replica greatly depends on the technology used. This invention does not relate to the specific configuration of such a replica and the latter is therefore not described in any more detail. The embodiment also includes a control apparatus for the MOS transistor and a control apparatus for the replica of the MOS transistor. A control apparatus for a MOS transistor generally includes a voltage source with an internal resistance. In the further explanation of the circuit arrangement, this control apparatus is described, in simplified form, as a current source. Describing the control apparatus as a current source does not preclude other configuration options. The circuit arrangement also includes an evaluation arrangement having an output and at least two inputs.

In one configuration of the switching apparatus, a replica of the MOS transistor is configured in such a manner that it is similar to the MOS transistor except for a scaling factor N. A control apparatus for the replica of the MOS transistor is configured in such a manner that it is similar to the control apparatus of the MOS transistor except for a scaling factor M. In the exemplary switching apparatus, the control connection of the replica of the MOS transistor is coupled to a first input of the evaluation arrangement. The control connection of the MOS transistor or the control connection of a further replica is coupled to a second input of the evaluation arrangement, the evaluation arrangement providing, at the output, a signal which indicates the start of switching of the MOS transistor by comparing the signal of the first input with the signal of the second input.

The coupling of components or connections is understood as meaning not only the direct connection of these connections. It is possible for active or passive components to be used or interposed for coupling purposes.

If, in the circuit arrangement, the MOS transistor is of the n-conducting type, the replica of the MOS transistor is also of the n-conducting type. If the first load path connection (source) of the MOS transistor is coupled to a supply potential and if the first load path connection (source) of the replica of the MOS transistor is coupled to a supply potential, the circuit arrangement is referred to as a LOW-SIDE switch.

If a load path connection of the replica of the MOS transistor is coupled to a supply potential, the replica of the MOS transistor represents the properties of the MOS transistor, taking into account the scaling factor N, as long as current is not yet flowing through the MOS transistor. If the control apparatus of the MOS transistor feeds a current into the control input of the MOS transistor, the control apparatus for the replica of the MOS transistor also feeds a current into the control connection of the replica of the MOS transistor. With suitable selection of the scaling factors N and M, the evaluation arrangement will not determine any difference in the signal profiles by comparing the coupled signals. This changes when the threshold voltage of the MOS transistor is reached. The MOS transistor begins to conduct current when the threshold voltage of the MOS transistor is reached. On account of the reaction of the load via the gate-drain capacitance, the signal remains in its state at the control connection of the MOS transistor despite a current being fed in. The fact that the gate-source voltage of a MOS transistor remains the same during switching is referred to as the Miller plateau. Since the replica of the MOS transistor is not coupled to a load, the voltage across its control connection continues to change. The evaluation arrangement thus clearly determines, by comparing the signals of the control inputs, that the MOS transistor is conducting current. The clear detection of the switching-on of the MOS transistor can be used to initiate further measures for controlling the MOS transistor. It is thus possible, for example, until the threshold voltage of the MOS transistor is reached, to feed in a current that is greater than the current which is fed in after the threshold voltage of the MOS transistor has been reached. That is to say the time before the threshold voltage of the MOS transistor is reached is minimized without having to dispense with gentle switching-on of the MOS transistor.

A method for detecting an operating state of a MOS transistor includes: a MOS transistor with a replica, the replica being operated with essentially the same current density as the MOS transistor and the operating state of the MOS transistor being detected by comparing the gate-source voltages of the MOS transistor and of the replica. Early detection of an operating state is made possible by the method by virtue of the replica being operated with a current density that is different to that of the MOS transistor. The switching-on time of the MOS transistor is detected early if the current density of the replica is lower than the current density of the MOS transistor. A MOS transistor reaches the Miller plateau as the current begins to flow in the load path. The Miller plateau is produced by the influence of a capacitance between the control connection and the load path connection. If a current begins to flow in the load path, this capacitance, the gate-drain capacitance $C_{gd}$, impresses a current into the control connection of the MOS transistor, which counteracts the current of the control apparatus. As a result, the operation of charging a capacitance, which is between the control connection and the second load path connection, the gate-source capacitance, is slowed down or stopped. For early detection of the switching-off time of the MOS transistor, the replica of the MOS transistor needs to be operated with a higher current density than the MOS transistor.

A switching apparatus having a MOS transistor and a replica, in which a load path connection of the replica of the MOS transistor is coupled to a load simulation, achieves the effect by virtue of the fact that the current density in the replica of the MOS transistor is lower than in the MOS transistor by suitably selecting the scaling factors N and M and by suitably selecting a load simulation. As a result of the lower current density in the replica of the MOS transistor, the Miller effect begins earlier in the replica of the MOS transistor than in the MOS transistor. The start of switching-on of the MOS transistor can be reliably detected using the comparison of the signals in the evaluation arrangement.

A load path connection of the first replica is coupled to a load simulation and the control connection of the first replica is coupled to a connection of the evaluation arrangement. The first and second load path connections of the second replica of the MOS transistor are coupled to a supply potential. The control connection of the second replica is coupled to a connection of the evaluation arrangement. Comparing the control signal of a replica, which is not coupled to a load simulation with the control signal of a replica, which is coupled to a load simulation results in the advantage that it is possible to determine a switching-on time that occurs somewhat earlier than the moment at which the MOS transistor is switched on. Depending on the configuration of the first and second replicas of the MOS transistor and their drive apparatuses, it is possible to determine a time that corresponds to the switching-on time or occurs earlier or later.

Predicting the switching-on time of the MOS transistor makes it possible to take into account delay times that occur in any circuit arrangement.

A switching apparatus having a MOS transistor, in which the control input of the first replica is coupled to the first input of the evaluation arrangement, the control input of the second replica is coupled to the second input of the evaluation arrangement and the control input of the MOS transistor is coupled to a third input of the evaluation arrangement, has the advantage that it is possible to determine both the exact switching-on time and the prediction of the switching-on time. Further important points on the transistor characteristic curve, for example current values, can also be determined using suitable configurations of the drive arrangements and the replicas. In one simple configuration of the switching apparatus having a MOS transistor, the output arrangement is in the form of a Schmitt trigger.

A switching apparatus having a MOS transistor is intended to detect the start of the switching operation and other important times during the switching operation of a MOS transistor. To this end, the voltages across two control connections of similar transistor structures are compared with one another. One transistor structure is the switching MOS transistor, and another transistor structure is a replica of the switching transistor. A load path connection of the MOS transistor and a load path connection of the replica are coupled to one another. The control connections of the MOS transistor and of the replica are charged using a current. The currents are different in a manner corresponding to the size of the MOS transistor and the size of the replica. The currents are configured in such a manner that the voltage changes appearing at the control connections are the same at the beginning of the charging process. If the control voltage of the MOS transistor reaches the threshold voltage, a current begins to flow over the load path of the MOS transistor. The voltage drop across the load reduces the voltage drop across the load path connections of the MOS transistor. The reduction in the voltage dropped across the load path connections of the MOS transistor is fed back to the control connection of the MOS transistor via the gate-drain capacitance, the Miller capacitance. Since the current of the charging apparatus is compensated for by the current of the Miller capacitance, the voltage at the control connection of the MOS transistor does not change from this time on. The resultant voltage difference between the control connection of the MOS transistor and the control connection of the replica is evaluated by using a comparison in an evaluation arrangement and a signal whose state signals that the MOS transistor has been switched on is provided at the output. On the basis of this, the charging current of the MOS transistor can be influenced in such a manner that a retarded transition to the defined transconductance range can take place. After the switching-on operation has been detected, a small constant current, a linearly rising current or a current, which is changed in discrete processes can be fed into the control connection of the MOS transistor, for example.

With this method, there is independence of process parameters, temperature or other environmental influences. The apparatus having a MOS transistor and a replica of the MOS transistor compares signals, which are influenced by the same parameters. For example, a shift in the Miller plateau voltage as a result of the fluctuation in the transistor threshold voltage has a smaller effect than when compared with a fixed reference voltage.

A possible expansion is a further comparison with a further replica of the MOS transistor. Provision is made of a further replica, which is operated with a current density that is different to that of the MOS transistor. This, for example lower, current density can be provided in the replica using a load simulation or a current source which is coupled to a load path connection of the replica. With suitable selection of the load simulation or of the current source, the Miller plateau voltage of the second replica is always somewhat smaller than the Miller plateau voltage across the control connection of the MOS transistor. Therefore, the switching-on operation in the replica having the simulated load begins earlier than in the MOS transistor. Comparing the voltage across the control connection of the first replica with the voltage across the control connection of the second replica provides a signal that detects the switching-on time of the second replica. Since the second replica is operated with a lower current density than the switching MOS transistor, a switching-on point that is before the switching-on point of the switching MOS transistor is detected. The time between the switching-on of the replica and the switching-on of the switching MOS transistor can be set using the size of the replica, the size of the driving current and the load simulation. This switching apparatus thus makes it possible to predict the switching-on time of the switching MOS transistor. The time between the switching-on times of the replica and of the switching MOS transistor can be set using the different current densities. In one embodiment, the charging currents of the first replica, of the second replica and of the switching MOS transistor are in the same ratio to one another as the input capacitance of the first replica, the input capacitance of the second replica and the input capacitance of the switching MOS transistor.

Figure 1:
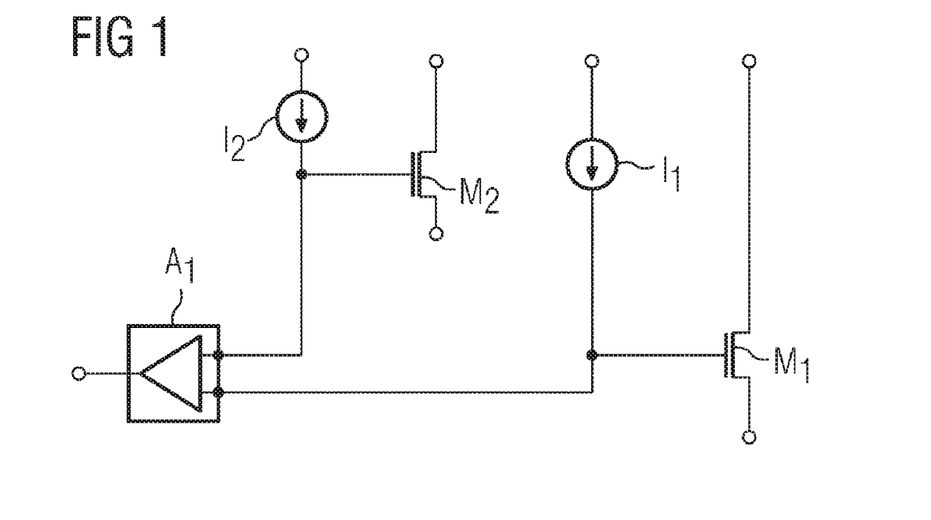
FIG. 1 illustrates a switching apparatus having a MOS transistor, which is designed to switch loads, a replica, and an evaluation apparatus.

FIG. 1 illustrates a switching apparatus having a MOS transistor M1, which is designed to switch loads, and a replica M2. The MOS transistor M1 has a first load path connection, a second load path connection and a control connection. A current source I1 is coupled to the control connection of the MOS transistor M1. The control connection of the MOS transistor M1 is coupled to a first control input of the evaluation arrangement A1. The replica M2 of the MOS transistor M1 has a first load path connection, a second load path connection and a control connection. A current source I2 is coupled to the control connection of the replica M2. The control connection of the replica M2 is coupled to a second input of the evaluation arrangement. The evaluation arrangement A1 has at least one output. The MOS transistor M1 and the replica M2 may be in the form of a DMOS, NMOS or PMOS. The switching apparatus may be configured as a HIGH-SIDE or LOW-SIDE arrangement. The current source arrangements I1 and I2 are designed to inject a current into the control connections of the MOS transistor M1 and of the replica M2. They are therefore suitable for charging or discharging the input capacitance of the MOS transistor M1 and of the replica M2. The replica M2 of the switching transistor M1 is designed in such a manner that the replica M2 has a similar behavior in the physical configuration, the layout.

Just like the MOS transistors M1 and M2, the current source arrangements I1 and I2 have scaling. This scaling with the factor M is configured in such a manner that the voltages across the control connections of the MOS transistor M1 and of the replica M2 have a similar profile until the switching-on time.

FIG. 2 illustrates a switching apparatus having NMOS transistors in a HIGH-SIDE configuration. A load path connection, the drain, of the MOS transistor M1 and a load path connection, the drain, of the replica M2 are coupled to a common reference potential Vbat. The second load path connection, the source, of the MOS transistor M1 is coupled to a load ZL. This load ZL may be in the form of a pure resistance, for example a lamp, or an inductance, for example a valve driver or a relay, or a mixed form. The second load path connection, the source, of the replica M2 is coupled to the first reference potential Vbat.

The control connection of the replica M2 is coupled to a current source arrangement I2. The control connection of the MOS transistor M1 is coupled to a current source arrangement formed from two constant current sources I1a and I1b. Depending on the state of the output of the evaluation arrangement A1, either the constant current source I1a or the constant current source I1b is coupled to the control input of the MOS transistor M1 via a switch.

A switch having a first and a second load path connection is also coupled to the control connection of the MOS transistor M1 and to the control connection of the replica M2. The switch has a control connection Reset. This switch is designed to set the control connections of the MOS transistor M1 and of the replica M2 to the same potential before the start of the switching-on operation. The second load path connections of the current sources I1a, I1b and I2 are coupled to a reference potential qp. In the case of a HIGH-SIDE configuration, this reference potential qp is the output of a charge pump.

At the start of the switching-on operation, the current source I1b is coupled to the control connection of the MOS transistor M1 via the switch s1. At the start of a switching-on operation, both control voltages exhibit the same behavior, with the result that the evaluation arrangement A1 cannot detect a difference by using the comparison. A capacitance, which is denoted using Cgd is always present between the first load path connection of a MOS transistor, the drain, and the control connection of a MOS transistor, the gate.

If current begins to flow in the switching transistor M1, the capacitance Cgd feeds an additional current into the control connection of the MOS transistor M1, with the result that the potential of the control connection of the transistor M1 remains in this state until the switching operation is concluded. Since the potential of the control connection of the replica M2 continues to rise, the evaluation arrangement A1 now detects a difference between the control connections by using the comparison. The evaluation arrangement A1 then connects the constant current source I1a to the control connection of the MOS transistor. If the current of the constant current source I1a is less than the current of the constant current source I1b, the operation of switching on the MOS transistor M1 is delayed exactly from that point in time at which the true switching-on operation begins. The time which is only used to charge the capacitances of the MOS transistors to the threshold voltage is overcome by the constant current source I1b as quickly as possible.

The operation of switching off the MOS transistor M1 is detected in the same way using this circuit arrangement. If the control connection of the MOS transistor reaches the Miller plateau as a result of Cgd being discharged, the evaluation arrangement A1 detects the start of the switching-off operation by using comparison.

Figure 3:
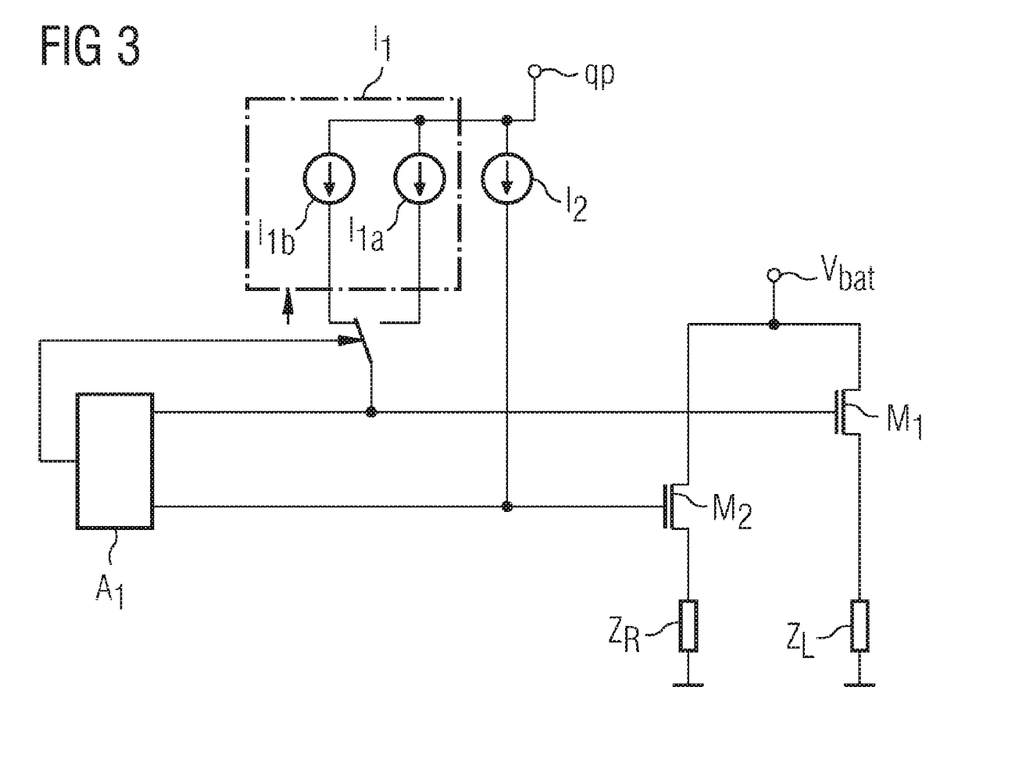
FIG. 3 illustrates a switching apparatus having a MOS transistor, which is designed to switch loads, and a replica in a HIGH-SIDE configuration.

FIG. 3 illustrates a switching apparatus having a MOS transistor M1 which is designed to switch loads, and a replica M2. The first load path connection of the MOS transistor M1, the drain, is coupled to a first supply potential Vbat. The first load path connection of the replica M2, the drain, is coupled to the first supply potential Vbat. The second load path connection of the MOS transistor M1, the source, is coupled to a load Z1. The second load path connection of the replica M2, the source, is coupled to a load simulation Zr. The impedance simulation Zr is configured in such a manner that the replica M2 is operated with a lower current density than the MOS transistor M1. The current source I2 which is coupled to the control connection of the replica M2 is configured in such a manner that the control connections of the MOS transistor M1 and of the replica M2 behave in a similar manner at the first moment of connection. Since the replica is operated with a lower current density than the MOS transistor M1, the Miller plateau of the replica M2 has a somewhat lower value than the Miller plateau of the MOS transistor M1.

If the control connections of the MOS transistor M1 and of the replica M2 reach their Miller plateau, the comparison by the evaluation arrangement A1 can be used to clearly detect that the transistor M1 is beginning to conduct current. The evaluation arrangement A1 is thus able to change over driving of the MOS transistor M1 from the current source I1b to the current source I1a using its signal. A smaller current is set in this case so that the switch-on edge begins in as flat a manner as possible. Since the switching apparatus described in FIG. 3 is a HIGH-SIDE configuration with NMOS transistors, the common reference potential of the current sources is a voltage source whose potential is higher than the common reference potential Vbat. This higher reference potential qp can be provided in different ways. Charge pumps are widely used in intelligent power circuits, smart power circuits. A DC converter with step-up conversion is likewise possible.

Figure 3A:
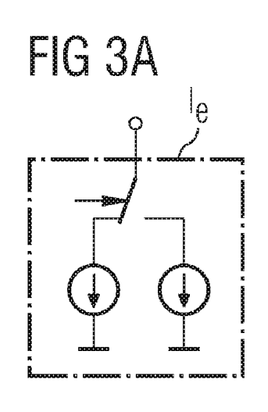

FIG. 3a illustrates a switching apparatus having a MOS transistor, in which the load simulation at the source of the replica is formed using a controllable current source I1. The controllable current source I1 is designed in such a manner that the replica M2 has a lower current density than the MOS transistor M1 while the MOS transistor M1 is being switched on so that the switching-on time of the MOS transistor M1 can be reliably predicted. In order to detect when the Miller plateau is reached while the MOS transistor M1 is being switched off, the controllable current source I1 is designed in such a manner that the replica M2 has a higher current density than the MOS transistor M1 while the MOS transistor M1 is being switched off.

Figure 3B:
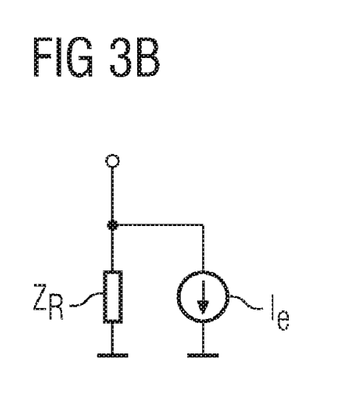

FIG. 3b illustrates a switching apparatus having a MOS transistor, in which the load simulation at the source of the replica is formed using a controllable current source I1 and an impedance Zr. In this exemplary embodiment, the load simulation Z1 is configured in such a manner that the replica M2 has the same current density as the MOS transistor M1. The controllable current source I1 feeds an additional current into the load path connection of the replica in such a manner that the replica has a lower current density than the MOS transistor while the MOS transistor is being switched on and the replica has a higher current density while the MOS transistor is being switched off. This arrangement is expedient if the load Z1 to be switched is not known when designing the MOS transistor M1 and its replica M2 or so that the person using the MOS transistor is not intended to be restricted to the load to be used.

Figure 4:
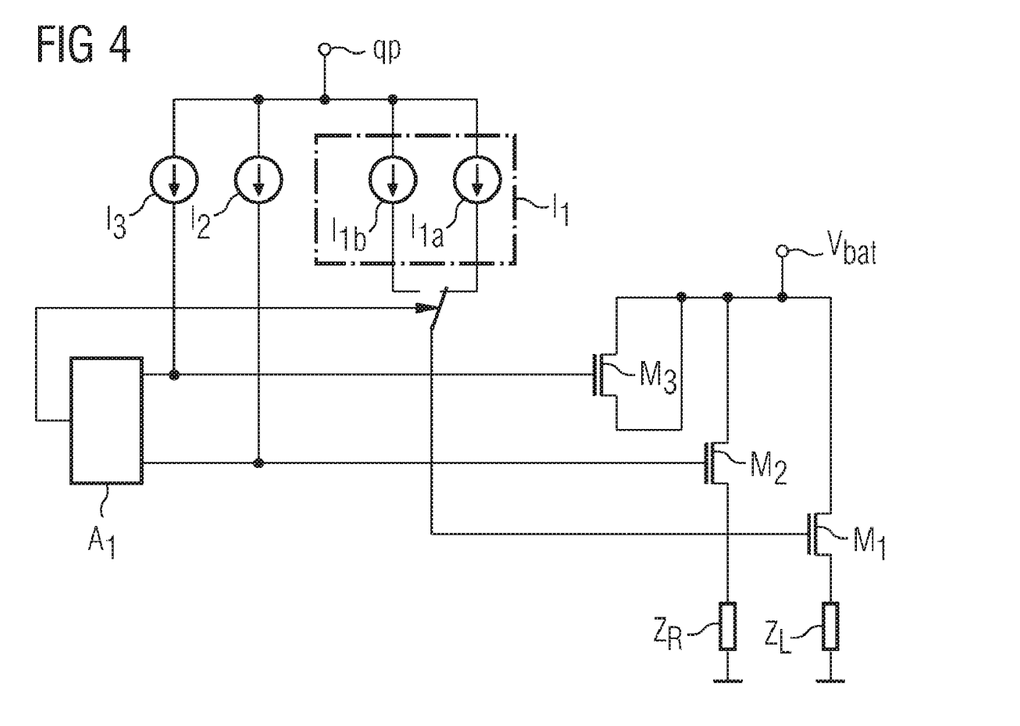
FIG. 4 illustrates a switching apparatus having a MOS transistor, which is designed to switch loads, a first replica with a load simulation, and a second replica in a HIGH-SIDE configuration.

FIG. 4 illustrates a switching apparatus in a HIGH-SIDE configuration with NMOS transistors. The MOS transistor is designed to switch a load Z1. A first replica M2 is designed to be able to drive a load simulation Zr. In addition, a second replica M3 is formed. The first load path connection of the MOS transistor M1, the drain, the first load path connection of the replica M2, the drain, and the first load path connection of the second replica M3, the drain, are coupled to a common supply potential Vbat. The second load path connection of the MOS transistor M1, the source, is coupled to a load Z1. The second load path connection of the replica M2, the source, is coupled to a load simulation Zr. The second load path connection of the second replica M3, the source, is coupled to the first supply potential Vbat. The control connection, the gate, of the MOS transistor M1 is coupled to a current source arrangement including two current sources I1a and I1b and a switch. The control connection of the replica M2 is coupled to a current source I2 and to an input of the evaluation arrangement A1. The control connection of the second replica M3 is coupled to a current source I3 and to an input of the evaluation arrangement A1. The start of current flow in the MOS transistor M1 is determined in this circuit arrangement by comparing the voltage across the control connection of the first replica M2 and the voltage across the control connection of the second replica M3. In accordance with this comparison, the evaluation arrangement changes over the current source arrangement including the current sources I1a and I1b. If the current density of the first replica M2 is configured in this exemplary embodiment in such a manner that it is equal to the current density of the MOS transistor M1, the evaluation arrangement can determine, by comparing the control connection of the first replica and the control connection of the second replica, when the MOS transistor M1 begins to conduct current. If the current density of the first replica M2 is designed in such a manner that it is lower than the current density of the MOS transistor M1, the evaluation arrangement can detect the start of the operation of switching on the MOS transistor M1, by comparing the control potentials of the first replica and of the second replica, shortly before the MOS transistor begins to switch. This means that the circuit arrangement according to FIG. 4 is designed to detect the start of the switching-on operation before the MOS transistor M1 switches. The voltages across the control connections of the transistors may also be taken into account. On account of the described configuration of the replicas, the evaluation arrangement provides a signal before the voltage across the control connection of the MOS transistor M1 reaches the threshold voltage. Depending on the configuration, it is thus possible to change over the current sources I1a and I1b of the MOS transistor M1 from, for example, a high current value to, for example, a low current value before the MOS transistor M1 begins to conduct current. This has the particular advantage that the MOS transistor M1 can be driven with a particularly small current without interfering and emitting current spikes being able to occur. A controllable current source or a combination of an impedance and a controllable current source, as already described in FIG. 3a and FIG. 3b, can also be used as the load simulation.

Figure 5:
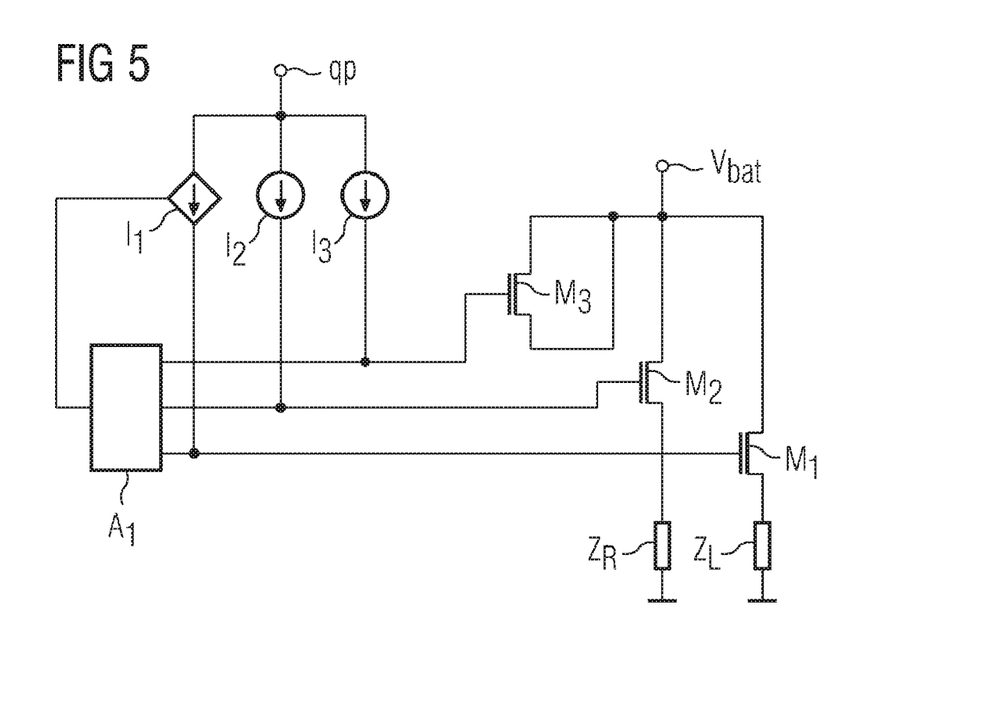
FIG. 5 illustrates a switching apparatus having a MOS transistor, which is designed to switch loads, a first replica with a load simulation, and a second replica in a HIGH-SIDE configuration.

FIG. 5 illustrates a switching apparatus having a MOS transistor M1, a first replica M2 and a second replica M3. The circuit arrangement is in the form of a HIGH-SIDE configuration. In contrast to FIG. 4, the control connection of the MOS transistor M1 is coupled to a controlled current source I1 and the control connection of the MOS transistor M1 is coupled to a third input of the evaluation arrangement A1. The switching apparatus in FIG. 5 is configured in such a manner that the evaluation arrangement A1 can determine the switching-on time or switching-off time of the transistor M1 by comparing the control potentials of the first replica M2 and of the second replica M3. After this switching-on point of the MOS transistor M1 has been detected, the evaluation arrangement A1 reduces the controllable current source I1 from a high charging current to a low charging current. The current source I1 is configured in such a manner that the evaluation arrangement A1 is able to control this current source I1 in a stepwise or linear manner, for example in the form of a ramp. It is possible to determine when the switching operation of the MOS transistor M1 has ended by comparing the control potentials of the MOS transistor M1 and of the control connection of the first replica M2. The switching operation of the MOS transistor M1 has ended when the voltage across the first load path connection (drain) changes only to an insignificant extent. From this point in time, an attempt is made to charge the voltage across the control connection of the MOS transistor M1 as quickly as possible in order to achieve an on resistance (Ron) which is as small as possible. On account of the different current densities of the MOS transistor M1 and its first replica M2, the evaluation arrangement A1 can detect this point in time by using a second comparison. After this comparison, the evaluation arrangement A1 switches the current source arrangement I1 to as high a current value as possible, so that the control connection of the MOS transistor M1 reaches as high a value as possible in order to achieve an on resistance (Ron) which is as small as possible.

In this exemplary embodiment too, the load simulation Zr can be replaced with a controllable current source or with a combination of a controllable current source and an impedance, as is illustrated in FIG. 3a and FIG. 3b.

Figure 6:
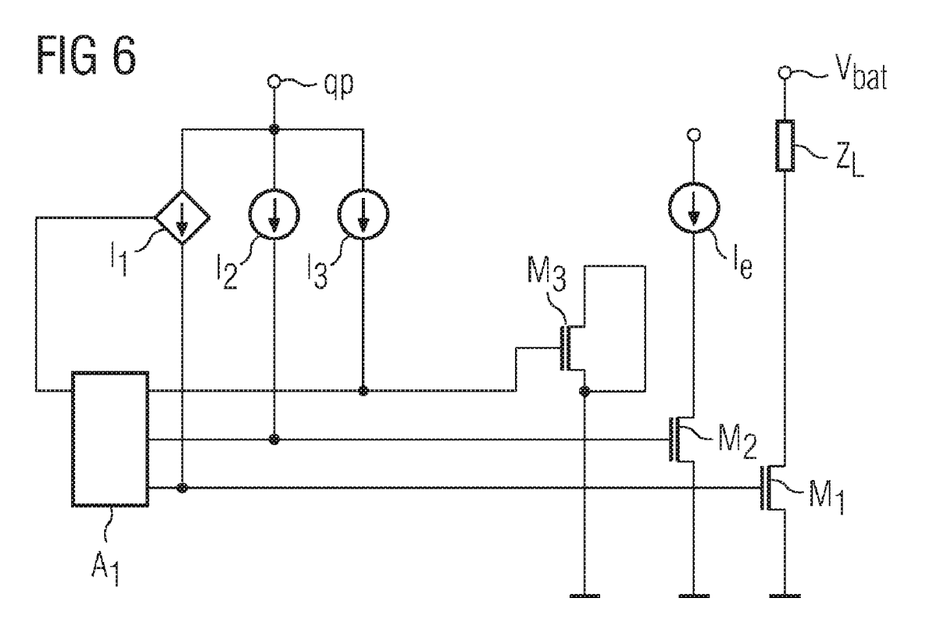
FIG. 6 illustrates a switching apparatus having a MOS transistor, which is designed to switch loads, a first replica with a load simulation, and a second replica in a LOW-SIDE configuration.

FIG. 6 illustrates a switching apparatus having a MOS transistor M1, a first replica M2 and a second replica M3. The MOS transistor M1 and its replicas M2 and M3 are in the form of NMOS transistors in a LOW-SIDE configuration. The common reference potential of the current source arrangement (qp) need no longer be necessarily provided by a charge pump in a LOW-SIDE configuration. The effect of the circuit arrangement in this LOW-SIDE configuration is similar to that in the HIGH-SIDE configurations of the circuit arrangements described in the preceding figures. The load simulation of the first replica can be formed using a current source, an impedance or a combination of the two.

FIG. 7 illustrates some voltage profiles which help to understand the circuit arrangements described in the preceding figures.

Figure 7A:
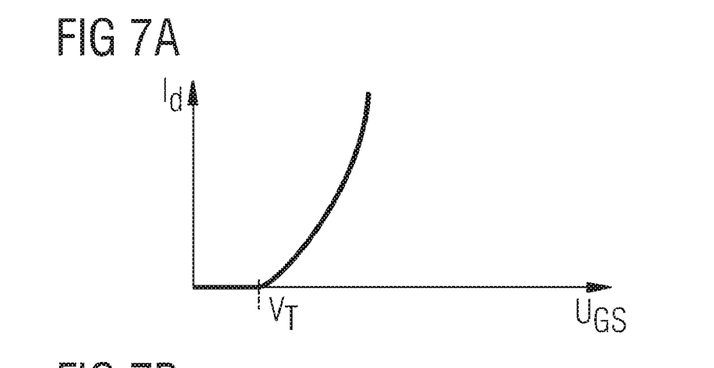
FIG. 7 illustrates a plurality of diagrams of some selected voltages, which are useful for explaining the preceding figures.

FIG. 7a illustrates the control characteristic curve of a MOS transistor. The control potential at the control connection ugs is plotted on the abscissa. The current through a load path connection Id is plotted on the ordinate. A load current Id does not flow through the load path connection until the threshold voltage vt.

Figure 7B:
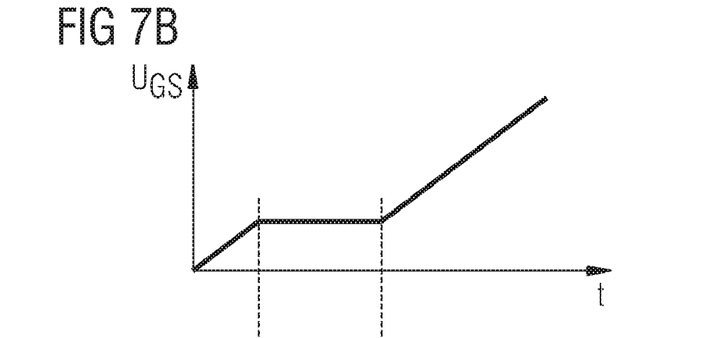

FIG. 7b illustrates a typical profile of the control voltage across a control connection of a MOS transistor Ugs against time. A rising profile of the control voltage can be seen in the first section of FIG. 7b. If the current in the control connection of a MOS transistor Ugs is constant, the voltage across the control connection rises in a virtually linear manner. If the current in the control connection of a MOS transistor rises in the form of a ramp, an approximately parabolic rise in the voltage across the control electrode is obtained. If the threshold voltage of the MOS transistor is reached, the control voltage remains at a voltage which stays the same. This profile is referred to as the Miller plateau on account of the feedback of the Miller capacitance Cgd or else the gate-drain capacitance. The voltage across the control connection of a MOS transistor remains at the Miller plateau until no further changes can be observed at the first load path connection (drain). That is to say the voltage across the control connection (gate) remains at the Miller plateau until the MOS transistor has completely switched the load on or off.

Figure 7C:
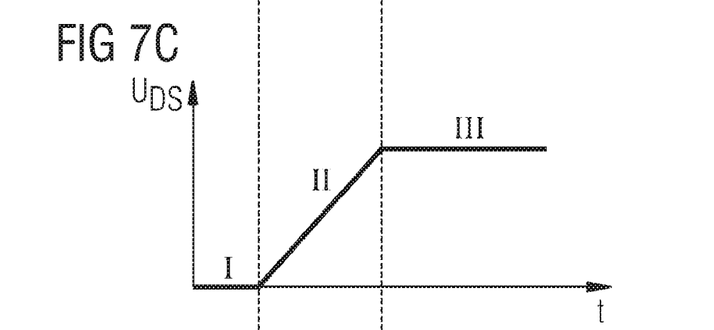

FIG. 7c illustrates the voltage, corresponding to FIG. 7b, across the first load path connection (drain) of a MOS transistor. In the first section I, a current does not flow through the load path connection, and the voltage across the load is at the lower reference potential in the case of a HIGH-SIDE configuration. If the MOS transistor has reached its maximum switching-on current with a very small on resistance (Ron), the MOS transistor is in the switched-on state. The transition between the state I and the state II is referred to as switching-on. Critical points on this curve are the transition between the state I and the state II and the transition between the state II and the state III. In this case, particularly high frequencies may occur during switching. The voltage profiles result in an analogous manner to FIG. 7b and FIG. 7c when a MOS transistor is being switched off.

Figure 7D:
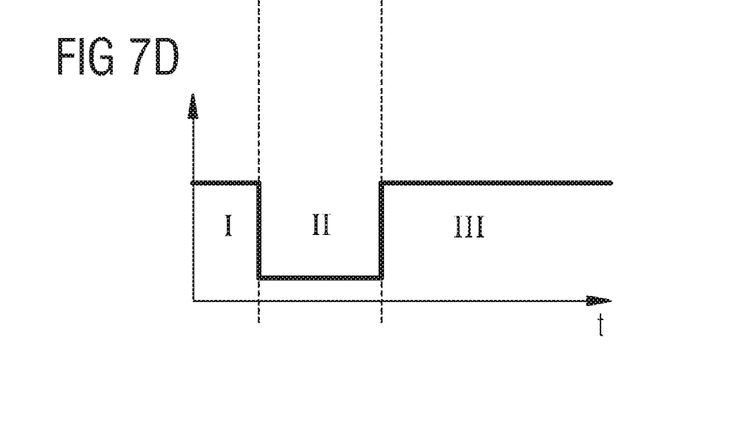

FIG. 7d illustrates a profile of a current I1 for switching on a MOS transistor with little interference. The profile of the current is based on the strategy that the MOS transistor is precharged to the threshold voltage as quickly as possible using its control connection. If the threshold voltage has been reached, the charging current is reduced in such a manner that a slow switching-on operation and a gentle transition to the switching-on operation result. If only slight changes in the voltage across the load path connection can still be observed, most of the switching-on operation has been concluded. The changes in the voltage across the load path connection now result from the reduction in the on resistance Ron of the MOS transistor. In order to rapidly reduce the Ron, the charging current is increased. This increase can be affected using a ramp, as illustrated. If this point in time can be reliably detected, it is also possible to change over to a high current.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switching apparatus comprising:
   a MOS transistor having a control connection and configured to switch on or off when a suitable control potential is provided at the control connection;
   at least one replica of the MOS transistor with a control connection, wherein the at least one replica of the MOS transistor is smaller than the MOS transistor;
   a control apparatus for the MOS transistor;
   a control apparatus for the replica of the MOS transistor;
   an evaluation arrangement with an output;
   the control connection of the replica of the MOS transistor being coupled to a first input of the evaluation arrangement, the control connection of the MOS transistor or the control connection of a further replica of the MOS transistor being coupled to a second input of the evaluation arrangement; and
   the evaluation arrangement providing, at the output, a signal which indicates the start of switching of the MOS transistor by comparing the signal of the first input with the signal of the second input.

2. The switching apparatus of claim 1, wherein a first and a second load path connection of the replica of the MOS transistor are coupled.

3. The switching apparatus of claim 1, wherein a load path connection of a second replica is coupled to a load simulation and the control connection of this second replica is coupled to the second connection of the evaluation arrangement.

4. The switching apparatus of claim 1, wherein a load path connection of the first replica is coupled to a load simulation.

5. The switching apparatus of claim 3, wherein the control input of the first replica is coupled to the first input of the evaluation arrangement and the control input of the second replica is coupled to the second input of the evaluation arrangement and the control input of the MOS transistor is coupled to a third input of the evaluation arrangement.

6. A switching apparatus comprising:
   a MOS transistor having a control connection and configured to switch on or off when a suitable control potential is provided at the control connection;
   at least one replica of the MOS transistor with a control connection;
   a control apparatus for the MOS transistor;
   a control apparatus for the replica of the MOS transistor;
   an evaluation arrangement with an output;
   the control connection of the replica of the MOS transistor being coupled to a first input of the evaluation arrangement, the control connection of the MOS transistor or the control connection of a further replica of the MOS transistor being coupled to a second input of the evaluation arrangement; and
   the evaluation arrangement providing, at the output, a signal which indicates the start of switching of the MOS transistor by comparing the signal of the first input with the signal of the second input,
   wherein the evaluation arrangement comprises a Schmitt trigger.

7. A method for detecting an operating state of a MOS transistor comprising:
   operating a replica of the MOS transistor with essentially the same current density as the MOS transistor, the replica of the MOS transistor being smaller than the MOS transistor; and
   detecting the operating state of the MOS transistor by comparing the gate-source voltages of the MOS transistor and of the replica.

8. The method of claim 7, wherein the current density of the replica is lower than or essentially the same as the current density of the MOS transistor in order to detect the switching-on time of the MOS transistor.

9. The method of claim 7, wherein the current density of the replica is higher than or essentially the same as the current density of the MOS transistor in order to detect the switching-off time of the MOS transistor.

10. Switching apparatus comprising:
   a MOS transistor with a first control apparatus at a control connection;
   a replica MOS transistor with second control apparatus at a control connection;
   means coupled to the control connections of the MOS transistor and replica MOS transistor for providing a start signal indicative of the start of the switching of the MOS transistor, wherein the MOS transistor is configured to switch loads directly coupled to a source or a drain of the MOS transistor.

11. The switching apparatus of claim 10, wherein the start signal is produced by comparing a signal from the control connections of the MOS transistor and the replica of the MOS transistor.

12. The switching apparatus of claim 11, wherein the means for producing a start signal further comprises an evaluation arrangement having a first input coupled to the control connection of the replica of the MOS transistor, having a second input coupled to the control connection of the MOS transistor and having an output producing the start signal.

13. The switching apparatus of claim 12, wherein a first and a second load path connection of the replica of the MOS transistor are coupled.

14. The switching apparatus of claim 12, wherein a load path connection of a second replica is coupled to a load simulation and the control connection of this second replica is coupled to the second connection of the evaluation arrangement.

15. The switching apparatus of claim 12, wherein a load path connection of the first replica is coupled to a load simulation.

16. The switching apparatus of claim 15, wherein the control input of the first replica is coupled to the first input of the evaluation arrangement and the control input of the second replica is coupled to the second input of the evaluation arrangement and the control input of the MOS transistor is coupled to a third input of the evaluation arrangement.

17. Switching apparatus comprising:
   a MOS transistor with a first control apparatus at a control connection;
   a replica MOS transistor with second control apparatus at a control connection;
   means coupled to the control connections of the MOS transistor and replica MOS transistor for providing a start signal indicative of the start of the switching of the MOS transistor,
   wherein the start signal is produced by comparing a signal from the control connections of the MOS transistor and the replica of the MOS transistor,
   wherein the means for producing a start signal further comprises an evaluation arrangement having a first input coupled to the control connection of the replica of the MOS transistor, having a second input coupled to the control connection of the MOS transistor and having an output producing the start signal, and
   wherein the evaluation arrangement comprises a Schmitt trigger.

18. The switching apparatus of claim 12, wherein the current density of the replica is lower than or essentially the same as the current density of the MOS transistor in order to produce the start signal.

19. The switching apparatus of claim 12, wherein the current density of the replica is higher than or essentially the same as the current density of the MOS transistor in order to produce the start signal.

20. The switching apparatus of claim 6, wherein the at least one replica of the MOS transistor is smaller than the MOS transistor.

21. The switching apparatus of claim 1, wherein the MOS transistor is configured to switch loads directly coupled to a source or a drain of the MOS transistor.

22. The switching apparatus of claim 10, wherein the replica of the MOS transistor is smaller than the MOS transistor.

* * * * *